(12) United States Patent
Kajiyama et al.

(10) Patent No.: US 7,629,637 B2
(45) Date of Patent: Dec. 8, 2009

(54) MAGNETIC RANDOM ACCESS MEMORY AND WRITE METHOD THEREOF

(75) Inventors: Takeshi Kajiyama, Yokohama (JP); Tsuneo Inaba, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 12/037,359

(22) Filed: Feb. 26, 2008

(65) Prior Publication Data
US 2008/0205125 A1 Aug. 28, 2008

(30) Foreign Application Priority Data
Feb. 27, 2007 (JP) .............................. 2007-047697

(51) Int. Cl.
*H01L 29/94* (2006.01)
(52) U.S. Cl. .................. 257/295; 257/315; 365/158
(58) Field of Classification Search .................. 257/295, 257/315; 365/158
See application file for complete search history.

(56) References Cited

U.S. PATENT DOCUMENTS 6,567,299 B2  5/2003  Kunikiyo et al.

2004/0179393 A1  9/2004  Yoda et al.

FOREIGN PATENT DOCUMENTS

| JP | 2002-231904 | 8/2002 |
|---|---|---|
| JP | 2004-47027 | 2/2004 |
| JP | 3738165 | 11/2005 |

*Primary Examiner*—Douglas M Menz
(74) *Attorney, Agent, or Firm*—Oblon, Spivak, McClelland, Maier & Neustadt, L.L.P.

(57) ABSTRACT

A magnetic random access memory includes first and second bit lines extending in a first direction, the second bit line being adjacent to the first bit line in a second direction, a first magnetoresistive effect element being connected to the first bit line and having a first fixed layer, a first recording layer, and a first nonmagnetic layer, and a second magnetoresistive effect element being adjacent to the first magnetoresistive effect element in the second direction and being connected to the second bit line and having a second fixed layer, a second recording layer, and a second nonmagnetic layer, the first and second recording layers being formed by a same first layer extending in the second direction.

20 Claims, 10 Drawing Sheets

"0" write

MAGNETIC RANDOM ACCESS MEMORY AND WRITE METHOD THEREOF

CROSS-REFERENCE TO RELATED APPLICATIONS

This application is based upon and claims the benefit of priority from prior Japanese Patent Application No. 2007-047697, filed Feb. 27, 2007, the entire contents of which are incorporated herein by reference.

BACKGROUND OF THE INVENTION

1. Field of the Invention

The present invention relates to a spin injection magnetization inversion type magnetic random access memory and a write method thereof.

2. Description of the Related Art

In a spin injection magnetization inversion type magnetic random access memory (MRAM), it is necessary to process a magnetic region of a magnetic tunnel junction (MTJ) element to be inverted into a small size in order to reduce an inversion current during a write operation. Moreover, it is necessary to reduce processing variations of the MTJ elements in order to improve an operation margin.

It is to be noted that information on documents of prior arts associated with the invention of this application is as follows:

[Patent document 1] Jpn. Pat. Appln. KOKAI Publication No. 2001-256773

[Patent document 2] Jpn. Pat. Appln. KOKAI Publication No. 2002-231904

[Patent document 3] Jpn. Pat. Appln. KOKAI Publication No. 2004-47027

[Patent document 4] Specification of US Pat. Appln. Publication No. 2004/0179393

BRIEF SUMMARY OF THE INVENTION

A magnetic random access memory according to a first aspect of the present invention comprises: a first bit line extending in a first direction; a second bit line which is adjacent to the first bit line in a second direction different from the first direction and which extends in the first direction; a first magnetoresistive effect element which is connected to the first bit line and which has a first fixed layer with a fixed magnetization direction, a first recording layer with an invertible magnetization direction, and a first nonmagnetic layer provided between the first fixed layer and the first recording layer, the magnetization directions of the first fixed layer and the first recording layer being parallel or antiparallel depending on the direction of a first current passed across the first fixed layer and the first recording layer; and a second magnetoresistive effect element which is adjacent to the first magnetoresistive effect element in the second direction and which is connected to the second bit line and which has a second fixed layer with a fixed magnetization direction, a second recording layer with an invertible magnetization direction, and a second nonmagnetic layer provided between the second fixed layer and the second recording layer, the first and second recording layers being formed by a same first layer extending in the second direction, the magnetization directions of the second fixed layer and the second recording layer being parallel or antiparallel depending on the direction of a second current passed across the second fixed layer and the second recording layer.

A write method of a magnetic random access memory according to a second aspect of the present invention, the magnetic random access memory comprising: a first bit line extending in a first direction; a second bit line which is adjacent to the first bit line in a second direction different from the first direction and which extends in the first direction; a first magnetoresistive effect element which is connected to the first bit line and which has a first fixed layer with a fixed magnetization direction, a first recording layer with an invertible magnetization direction, and a first nonmagnetic layer provided between the first fixed layer and the first recording layer; and a second magnetoresistive effect element which is adjacent to the first magnetoresistive effect element in the second direction and which is connected to the second bit line and which has a second fixed layer with a fixed magnetization direction, a second recording layer with an invertible magnetization direction, and a second nonmagnetic layer provided between the second fixed layer and the second recording layer, the first and second recording layers being formed by a same first layer extending in the second direction, the write method comprising: passing a write current across the first fixed layer and the first recording layer, and orienting the magnetization of the first recording layer parallel or antiparallel with the magnetization of the first fixed layer in accordance with the direction in which the write current is passed, in the case of writing into the first magnetoresistive effect element, wherein the write current is adjusted to control the expansion of the magnetization inversion of the first recording layer.

DETAILED DESCRIPTION OF THE INVENTION

Embodiments of the present invention will hereinafter be described with reference to the drawings. In the description, like reference numbers are assigned to like parts throughout the drawings.

A magnetic random access memory (MRAM) is explained in the following first to third embodiments. A magnetic tunnel junction (MTJ) element (magnetoresistive effect element) used in each of the embodiments is explained in the forth embodiment.

[1] First Embodiment

[1-1] Structure

Figure 1:
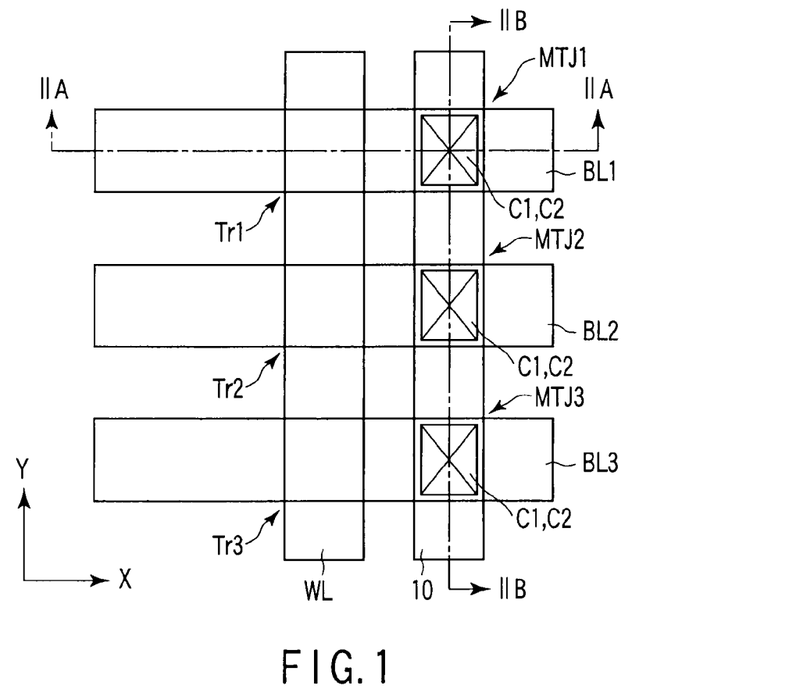
FIG. 1 is a plan view showing a magnetic random access memory according to a first embodiment of the present invention.
Figure 2A:
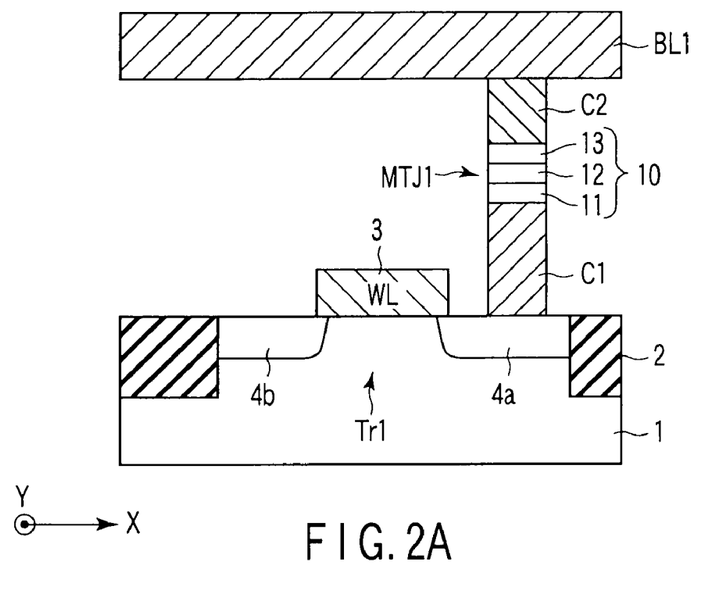
FIG. 2A is a sectional view along the IIA-IIA line in FIG. 1.
Figure 2B:
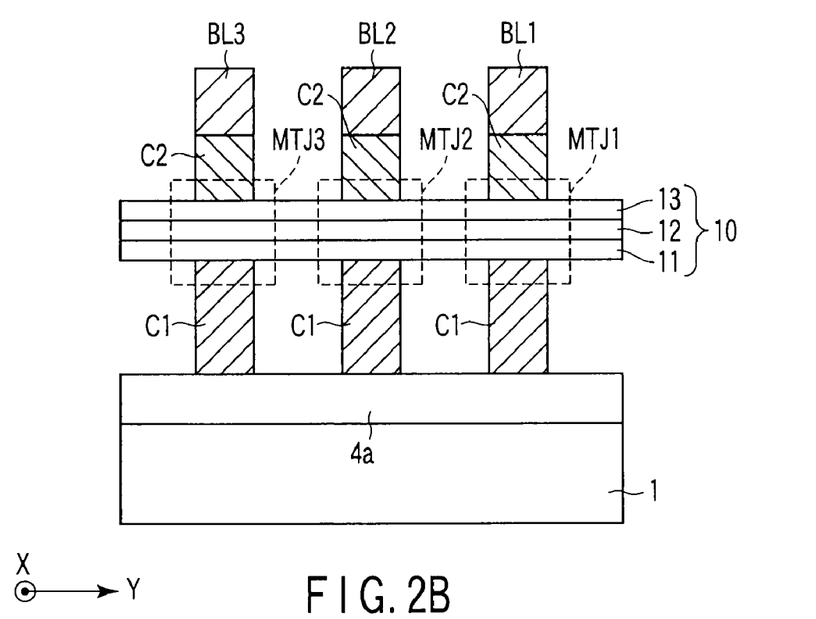
FIG. 2B is a sectional view along the IIB-IIB line in FIG. 1.

FIG. 1 shows a plan view of a magnetic random access memory according to the first embodiment of the present invention. FIG. 2A shows a sectional view along the IIA-IIA line in FIG. 1. FIG. 2B shows a sectional view along the IIB-IIB line in FIG. 1. The structure of the magnetic random access memory according to the first embodiment is described below.

As shown in FIG. 1, a plurality of adjacent bit lines BL1, BL2, BL3 extend in an X direction, and a word line WL extends in a Y direction (direction intersecting with the X direction) to traverse the bit lines BL1, BL2, BL3. Under the bit lines BL1, BL2, BL3, an MTJ film 10 seamlessly extends in the Y direction. Thus, the MTJ film 10 is formed in the shape of a line extending in the same direction as the direction in which the word line WL extends, and continuously traverses a plurality of cells without being divided cell by cell. Here, MTJ elements MTJ1, MTJ2, MTJ3 of the respective cells are located at the intersections of the MTJ film 10 and the bit lines BL1, BL2, BL3. The top surfaces of the MTJ elements MTJ1, MTJ2, MTJ3 are connected to the bit lines BL1, BL2, BL3 via contacts C2. The bottom surfaces of the MTJ elements MTJ1, MTJ2, MTJ3 are connected to transistors Tr1, Tr2, Tr3 via contacts C1.

As shown in FIG. 2A, an element separation insulating film 2 having a shallow trench isolation (STI) structure is formed in a semiconductor substrate (e.g., a silicon substrate) 1. A gate electrode 3 is formed on the semiconductor substrate 1 via a gate insulating film (not shown), and source/drain diffusion layers 4a, 4b are formed in the semiconductor substrate 1 on both sides of the gate electrode 3, such that the transistor (e.g., a MOS transistor) Tr1 which functions as a switching element is formed.

The contact C1 is disposed on the source/drain diffusion layer 4a of the transistor Tr1, and the MTJ element MTJ1 is disposed on this contact C1. The MTJ element MTJ1 is formed by the MTJ film 10 in which a fixed layer (pin layer) 11, a nonmagnetic layer 12 and a recording layer (free layer) 13 are stacked in order. The contact C2 is disposed on the top surface of the MTJ element MTJ1, and the bit line BL1 is disposed on this contact C2. The bit line BL1 is connected to, for example, a power supply terminal and a ground terminal.

As shown in FIG. 2B, all of the fixed layer 11, the nonmagnetic layer 12 and the recording layer 13 constituting the MTJ film 10 are seamless in the Y direction. However, in each of the MTJ elements MTJ1, MTJ2, MTJ3, the recording layer 13 is connected to the bit line BL1, BL2, BL3 via the contact C2 and the fixed layer 11 is connected to the source/drain diffusion layer 4a via the contact C1.

[1-2] Principle

Figure 3:
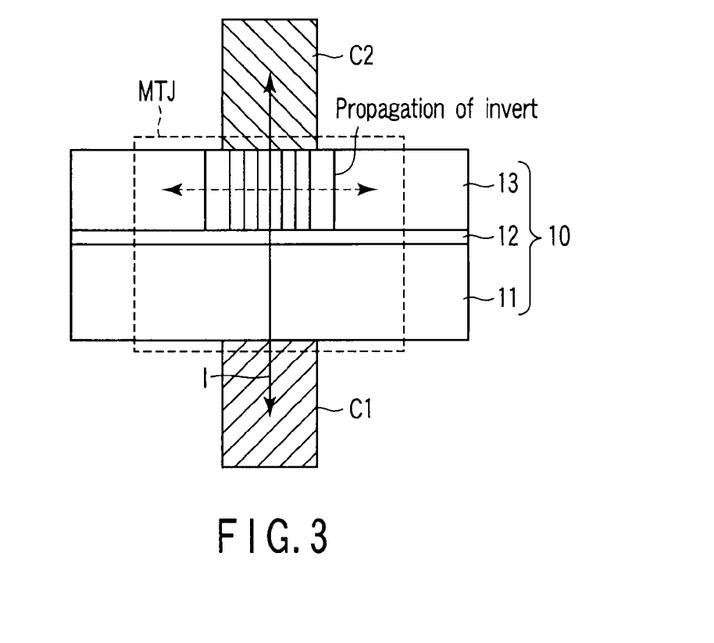
FIG. 3 is a diagram for explaining the principle of the propagation of a write inverted portion according to the first embodiment of the present invention.

FIG. 3 shows a diagram for explaining the principle of the propagation of a write inverted portion according to the first embodiment of the present invention. The principle of the propagation of the write inverted portion according to the first embodiment is described below.

As shown in FIG. 3, in a write operation based on spin injection magnetization inversion, the transistor of a selected cell is turned on, and a current I is passed perpendicularly to the film surface of the MTJ element MTJ. Then, the direction of the magnetization of the recording layer 13 is set to be the same as or different from the direction of the magnetization of the fixed layer 11 depending on whether the current I is passed from the fixed layer 11 to the recording layer 13 or from the recording layer 13 to the fixed layer 11. That is, in the MTJ element MTJ, the magnetization directions of the fixed layer 11 and the recording layer 13 are parallel or antiparallel with each other depending on the direction of the current I passed across the fixed layer 11 and the recording layer 13.

In such a write operation, the magnetization inversion propagates horizontally in the recording layer 13 if the time of passing the write current I is too long. That is, the magnetization inversion region of the recording layer 13 expands due to magnetic wall movement caused by the propagation of spin torque and due to heat. If this effect is used, the time of passing the current can be increased to expand the magnetization inversion region even with the same inverted current density Jc. This can be explained by the magnetic wall movement caused by the propagation of the spin, and the effect can also be enhanced by the heat generation from the passage of the current.

[1-3] Write Operation

Figure 4A:
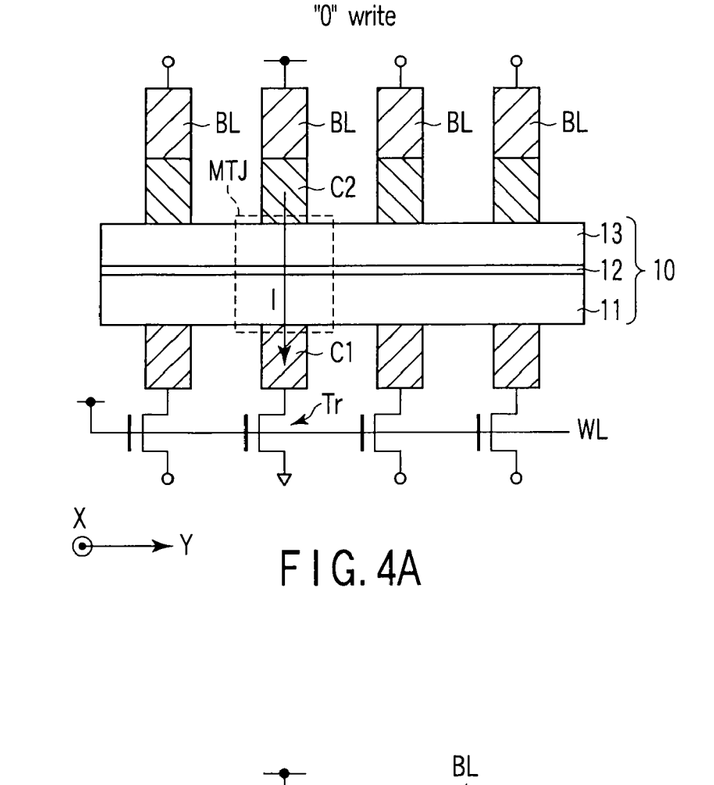
FIGS. 4A and 4B are diagrams for explaining a "0" write operation according to the first embodiment of the present invention.
Figure 4B:
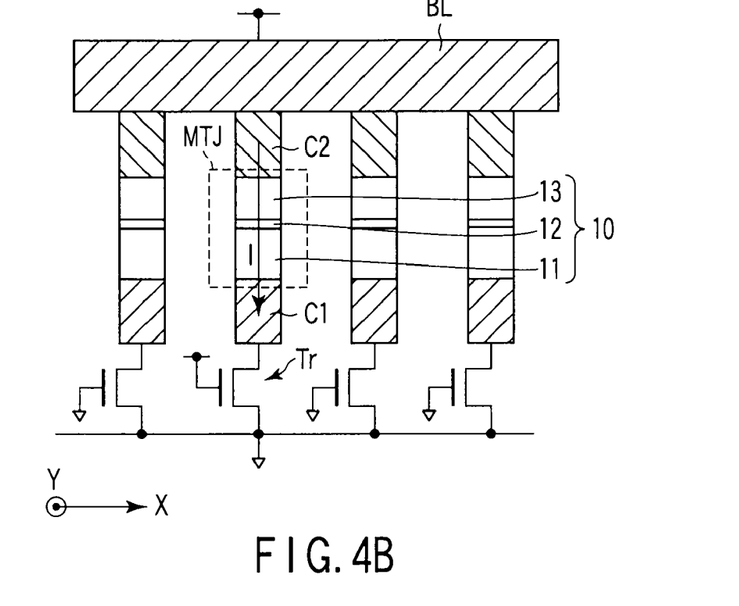
Figure 5A:
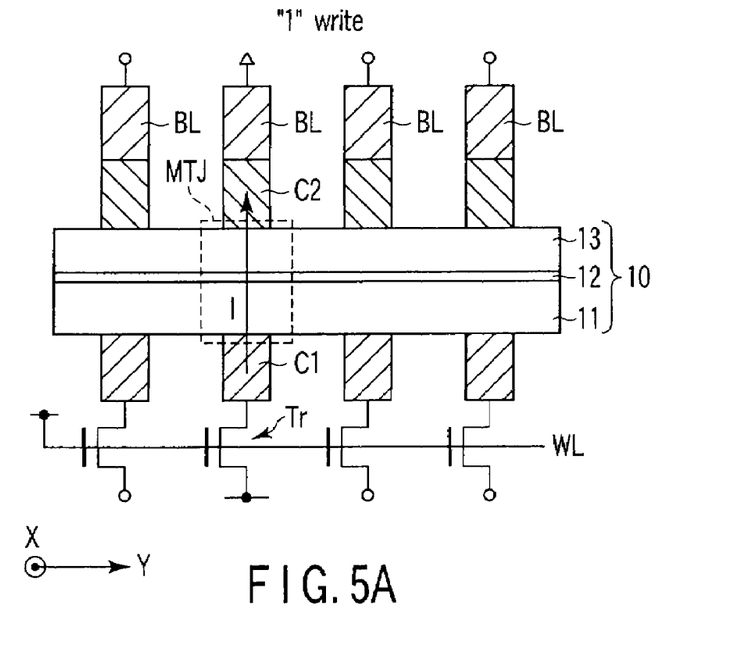
FIGS. 5A and 5B are diagrams for explaining a "1" write operation according to the first embodiment of the present invention.
Figure 5B:
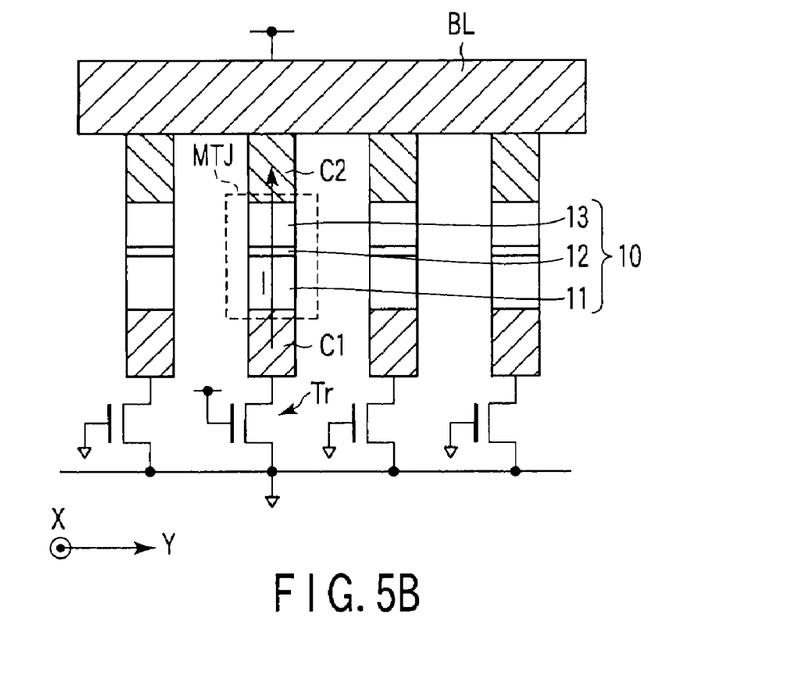

FIGS. 4A and 4B show diagrams for explaining a "0" write operation according to the first embodiment of the present invention. FIGS. 5A and 5B show diagrams for explaining a "1" write operation according to the first embodiment of the present invention. Here, FIGS. 4A and 5A are schematic sectional views in the direction in which the word line extends, FIGS. 4B and 5B are schematic sectional views in the direction in which the bit lines extend. The write operation according to the first embodiment is described below.S As shown in FIGS. 4A and 4B, when "0" data is written, the current I is passed from the recording layer 13 to the fixed layer 11 of the MTJ element MTJ. That is, electrons e are injected from the side of the fixed layer 11 to the side of the recording layer 13. This orients the magnetizations of the fixed layer 11 and the recording layer 13 into the same direction and parallel with each other. This low resistance state Rp is defined as the "0" data.

As shown in FIGS. 5A and 5B, when "1" data is written, the current I is passed from the fixed layer 11 to the recording layer 13 of the MTJ element MTJ. That is, the electrons e are injected from the side of the recording layer 13 to the side of the fixed layer 11. This orients the magnetizations of the fixed layer 11 and the recording layer 13 into opposite directions and antiparallel with each other. This high resistance state Rap is defined as the "1" data.

Here, as shown in FIGS. 4A and 5A, the MTJ film 10 is seamless in the direction of the word line, but when viewed from the direction of this word line, the bit line BL above the MTJ film 10 is divided cell by cell, and the transistor Tr below the MTJ film 10 is divided cell by cell. Thus, there is no production of a sneak current running to the adjacent cells and no deterioration of a read margin. However, it is necessary to control, for example, the time of passing the write current for the magnetization inversion region of the recording layer 13 so that the magnetic wall moved by the write current I may be stopped between the adjacent cells.

Figure 6:
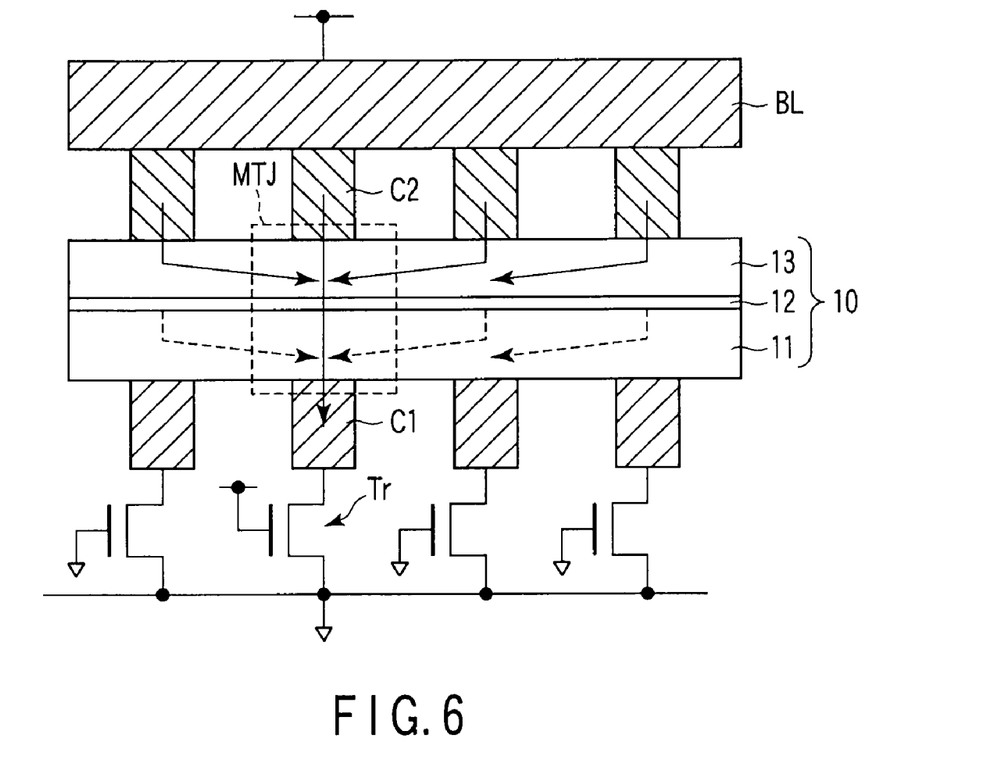
FIG. 6 is a schematic diagram in which an MTJ film according to the first embodiment of the present invention extends in a bit line direction.

In addition, as shown in FIG. 6, when the MTJ films 10 are made seamless in the direction parallel with the bit line BL, a sneak current running through conductive parts including the MTJ film 10 is produced, which might deteriorate the read margin. Therefore, it is desirable that the MTJ film 10 is divided cell by cell in the direction of the bit line BL as shown in FIGS. 5A and 5B rather than extending in the same direction as the bit line BL as shown in FIG. 6.

[1-4] Read Operation

In a read operation of the first embodiment, a magnetoresistive effect is utilized.

The transistor Tr coupled to the MTJ element MTJ of a selected cell is turned on, and a read current is passed in the direction of the transistor Tr, for example, from the bit line BL through the MTJ element MTJ. Then, whether data is the "1" data or the "0" data is judged by the resistance value of the MTJ element MTJ read on the basis of the read current.

In addition, during the read operation, a constant voltage may be applied to read a current value or a constant current may be applied to read a voltage value.

[1-5] Effect

According to the first embodiment described above, the MTJ film 10 seamlessly extends in the word line direction without being divided cell by cell. That is, as the MTJ film 10 has only to be formed in the shape of a line, there is no need to process the MTJ element with good controllability so that the area of the MTJ element may be small in each cell, resulting in an easier work process. Thus, it is possible to achieve easier controllability of processed dimensions and to suppress the processing variations of the MTJ elements.

Furthermore, even when the MTJ film 10 is formed in the shape of a line, the time of passing the write current is adjusted and the expansion of the magnetization inversion region of the recording layer 13 is controlled such that a cell-by-cell write operation can be achieved.

[2] Second Embodiment

A second embodiment is an example in which, for example, the time of passing a write current is adjusted to realize a multivalued memory.

[2-1] Principle

Figure 7A:
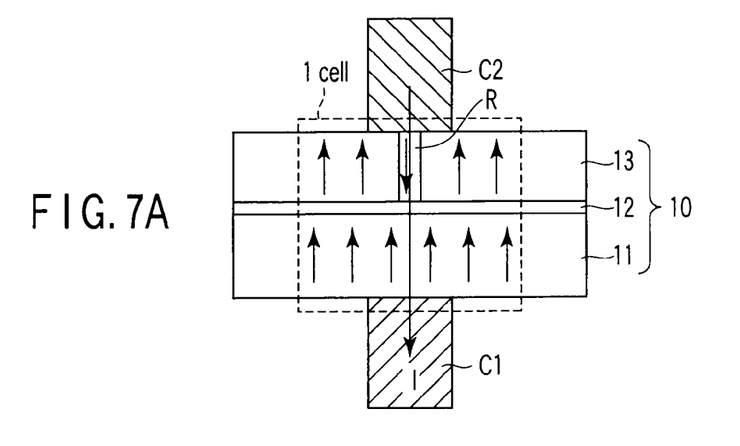
FIGS. 7A to 7C are diagrams for explaining the principle of the propagation of a write inverted portion according to a second embodiment of the present invention.
Figure 7B:
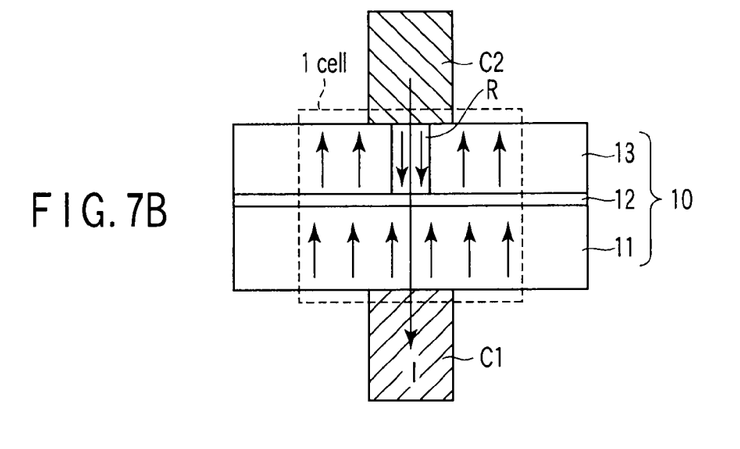
Figure 7C:
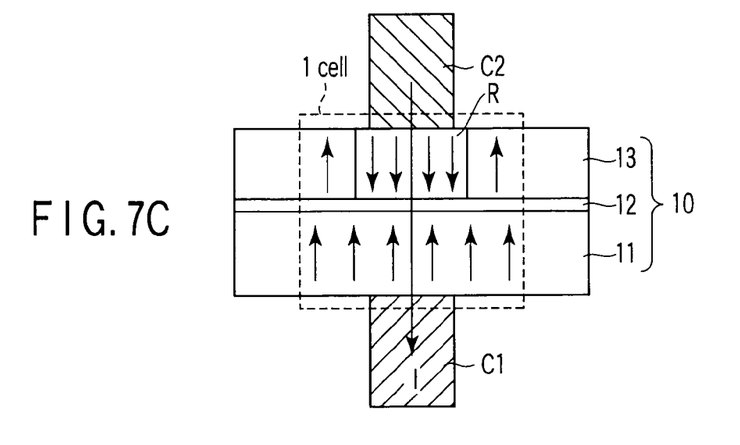
Figure 8:
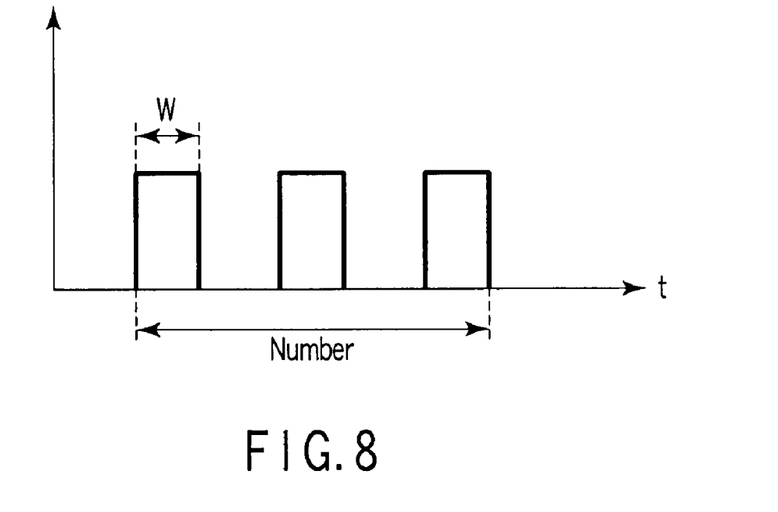
FIG. 8 is a waveform diagram of current pulses in a write operation according to the second embodiment of the present invention.

FIGS. 7A to 7C show diagrams for explaining the principle of the propagation of a write inverted portion according to the second embodiment of the present invention. FIG. 8 shows a waveform diagram of current pulses in a write operation according to the second embodiment of the present invention. The principle of the propagation of the write inverted portion according to the second embodiment is described below.

As shown in FIGS. 7A to 7C, when the write current I is passed, a magnetization inversion region R (write range) horizontally expands. That is, the magnetization of the recording layer 13 which has been upward in an initial state is gradually inverted downward in the vicinity of the contact C2. In other words, the magnetizations of the fixed layer 11 and the recording layer 13 become increasingly antiparallel in one cell.

Here, as the resistance value of the MTJ element MTJ changes depending on whether the magnetizations of the fixed layer 11 and the recording layer 13 are parallel or antiparallel with each other, the resistance value of the MTJ element MTJ changes depending on the range in which the magnetization inversion region R expands. Thus, the resistance value of one cell can be controlled, and a multivalued memory can be realized.

As shown in FIG. 8, the write current I could be adjusted, for example, by changing the time of passing the write current (the number of current pulses) or by changing the width W of the current pulse. In addition, in the present embodiment, if the pulse width is reduced, writing becomes unstable and the amount of current has to be increased. It is therefore advisable to adjust the current amount by increasing or decreasing the pulse width rather than by increasing the number of pulses. Thus, it is useful to have a system which controls the pulse width of the write current to control the write range.

[2-2] Write Operation

A write operation realizing the multivalued memory is described with FIGS. 9A to 9C, FIG. 10 and FIG. 11.

In the write operation according to the second embodiment, the write current I is adjusted using the spin injection magnetization inversion technique as in the first embodiment to control the magnetization inversion region R. Here, in the first embodiment, all the magnetizations of the recording layer 13 in one cell are parallel or antiparallel with the magnetization of the fixed layer 11 such that a binary state is created. On the contrary, in the second embodiment, a condition where both a parallel state and a antiparallel state are mixed in one cell is created in addition to the binary state such that a threefold or more multivalued memory is realized.

For example, the following three resistive states can be created to realize the threefold memory.

Figure 9A:
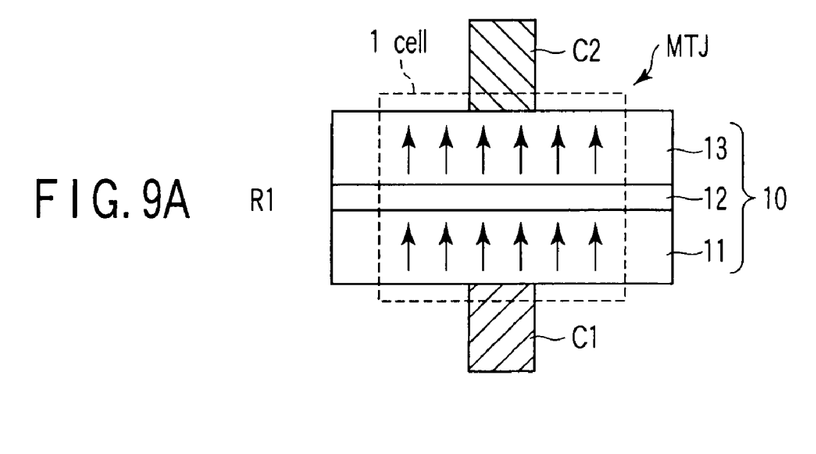
FIGS. 9A to 9C are sectional views of three MTJ elements in a resistive state according to the second embodiment of the present invention.

As shown in FIG. 9A, when all the magnetizations of the recording layer 13 in one cell are parallel with the magnetization of the fixed layer 11, the resistance value of the MTJ element MTJ is the lowest. The resistance value in this case is a first resistance value R1.

Figure 9B:
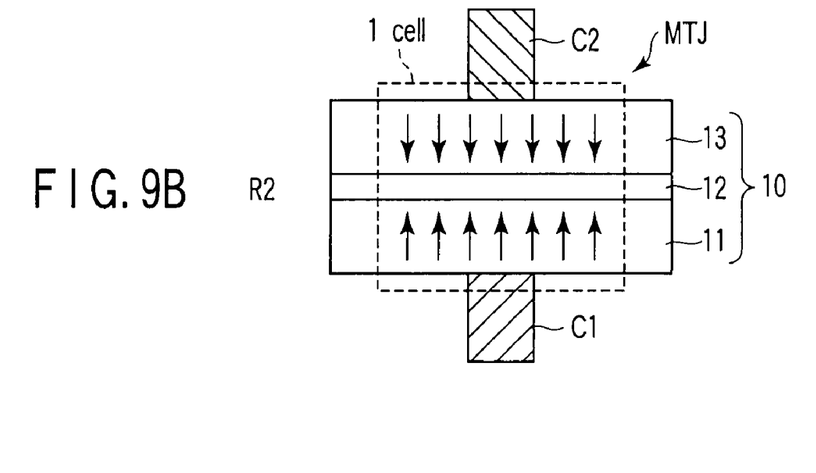

As shown in FIG. 9B, when all the magnetizations of the recording layer 13 in one cell are antiparallel with the magnetization of the fixed layer 11, the resistance value of the MTJ element MTJ is the highest. The resistance value in this case is a second resistance value R2.

Figure 9C:
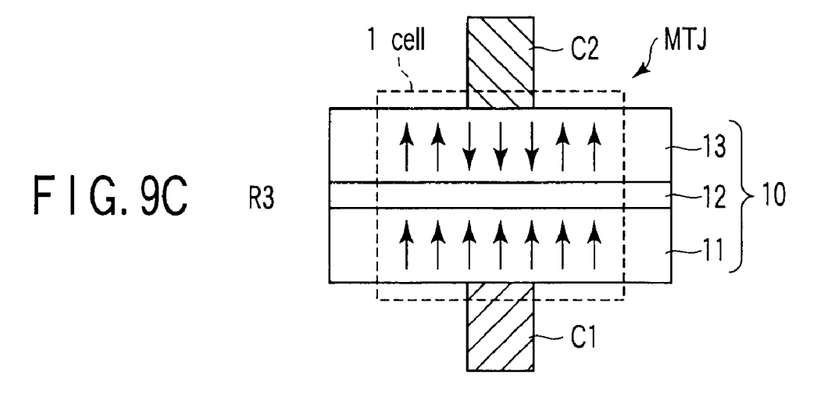

As shown in FIG. 9C, when there are both the parallel and antiparallel magnetizations described above in one cell, that is, when the recording layer 13 has the magnetization parallel with the magnetization of the fixed layer 11 and the magnetization antiparallel with the magnetization of the fixed layer 11, the resistance value of the MTJ element MTJ takes a value between the above-mentioned first and second resistance values R1 and R2. The resistance value in this case is a third resistance value R3.

Figure 10:
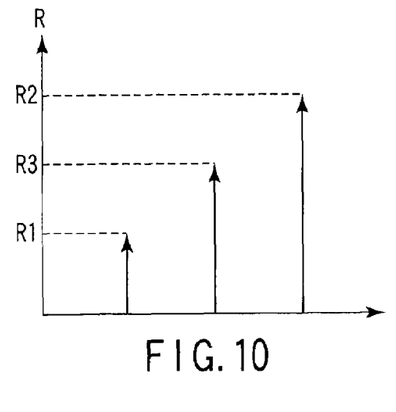
FIG. 10 is a diagram showing three resistance values of a multivalued memory according to the second embodiment of the present invention.

Therefore, as shown in FIG. 10, the three resistance values R1, R2 and R3 can be created in the present example.

Figure 11:
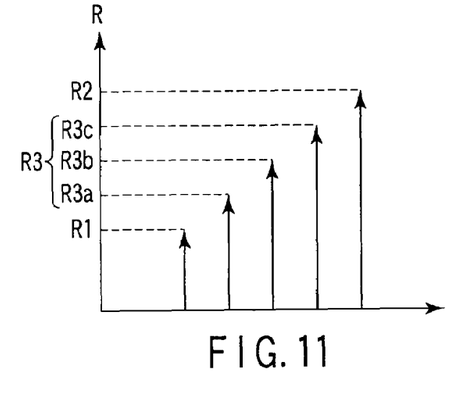
FIG. 11 is a diagram showing five resistance values of the multivalued memory according to the second embodiment of the present invention.

Here, as shown in FIG. 11, if the third resistance value R3 is provided with more detailed threshold values, three resistance values R3a, R3b and R3c can be created, for example. In this case, a fivefold memory can be realized. Thus, threefold or more resistance values can be created depending on how the threshold value of the third resistance value R3 is set.

In addition, it is desirable to judge whether the initial state is "1" or "0" in order to control the multivalued conversion in accordance with the range of the magnetization inversion region in one cell as in the present embodiment. To this end, there may be a step of reading data in a selected cell before writing.

Furthermore, the read operation may be inserted into a write sequence. That is, a verify-write for adjusting writing while reading the value of the selected cell may be carried out. This verify-write is carried out, for example, in the following manner. First, a spin injection write is performed on the selected cell (first step). After this write operation has been performed, the resistance value of the selected cell is read, and whether this resistance value has reached a predetermined threshold value is judged (second step). When it is judged that the resistance value has not reached the predetermined threshold value, the spin injection write is again performed on the selected cell (third step). In this write operation in the third step, the time of passing the write current I, for example, can be adjusted on the basis of the time of the write operation in the first step. Carrying out such a verify-write makes it possible to enhance the controllability of the resistance value of the MTJ element MTJ.

[2-3] Read Operation

In the second embodiment, the read operation utilizing the magnetoresistive effect similar to that in the first embodiment described above is carried out, and is therefore not explained.

[2-4] Effect

According to the second embodiment described above, it is possible to obtain an effect similar to that in the first embodiment. Moreover, in the second embodiment, the expansion of the write current I is adjusted to control the magnetization inversion region R in one cell. This makes it possible to create threefold or more resistance values in one cell and realize a multivalued memory.

[3] Third Embodiment

A third embodiment is an example in which at least one of the upper and lower contacts of the MTJ element in each of the embodiments is reduced in size.

[3-1] Structure

Figure 12:
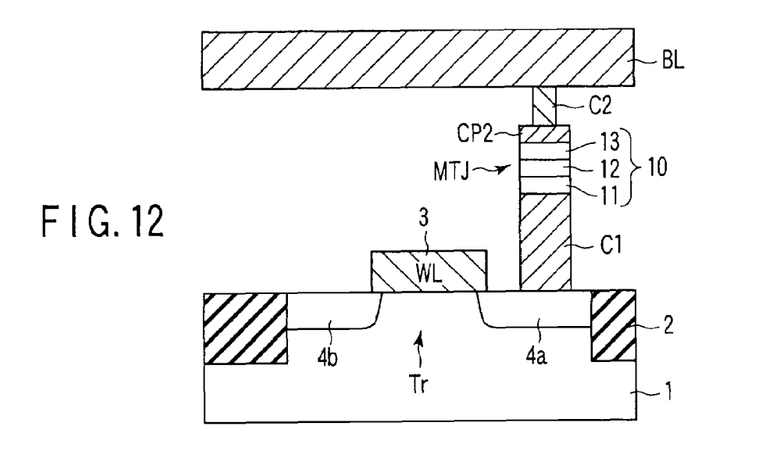
FIG. 12 is a sectional view of a magnetic random access memory according to a third embodiment of the present invention in a bit line direction.
Figure 13:
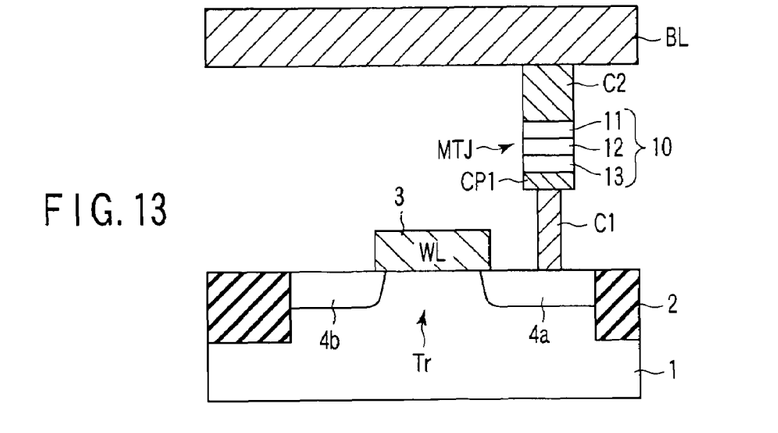
FIG. 13 is a sectional view of the magnetic random access memory according to the third embodiment of the present invention in the bit line direction.
Figure 14:
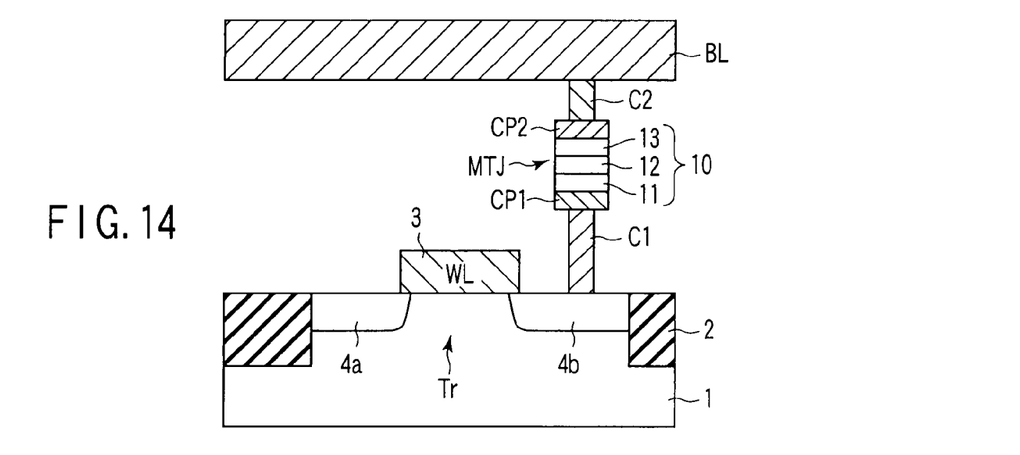
FIG. 14 is a sectional view of the magnetic random access memory according to the third embodiment of the present invention in the bit line direction.

FIGS. 12 to 14 show sectional views of a magnetic random access memory according to a third embodiment of the present invention in a bit line direction. The structure of the magnetic random access memory according to the third embodiment is described below.

As shown in FIGS. 12 to 14, the third embodiment is different from the first embodiment is that at least one of upper and lower contacts C1, C2 of an MTJ element MTJ is thinly formed, and cap layers CP1, CP2 are provided between the contacts C1, C2 and the MTJ element MTJ.

In FIG. 12, the contact C2 on the MTJ element MTJ is thinner. Moreover, the cap layer CP2 is provided between the contact C2 and the MTJ element MTJ. The bit line direction width of the part of the contact C2 contacting a recording layer 13 via the cap layer CP2 is smaller than the bit line direction width of the recording layer 13.

FIG. 13 shows an example of a so-called top pin structure. That is, since a fixed layer 11 is located higher than the recording layer 13, the contact C1 is connected to the recording layer 13. Thus, in FIG. 13, the contact C1 under the MTJ element MTJ is thinner. Further, the cap layer CP1 is provided between the contact C1 and the MTJ element MTJ. The bit line direction width of the part of the contact C1 contacting the recording layer 13 via the cap layer CP1 is smaller than the bit line direction width of the recording layer 13.

In FIG. 14, the contacts C1, C2 above and under the MTJ element MTJ are thinner. Moreover, the cap layer CP1 is provided between the contact C1 and the MTJ element MTJ, and the cap layer CP2 is provided between the contact C2 and the MTJ element MTJ.

In addition, in FIGS. 12 to 14, the contacts C1, C2 may be located in the center of the MTJ element MTJ (the recording layer 13) or may be located off center.

It is desirable that the resistance values of the cap layers CP1, CP2 are, for example, about one digit higher than the resistance value of the recording layer 13. The material of the cap layers CP1, CP2 includes, for example, the material of a nonmagnetic layer 12 or a barrier metal material with a high sheet resistance. It should be noted here that the section [4-3] described later is referred to for the material of the nonmagnetic layer 12. The barrier metal material includes, for example, the following materials (a) to (k).

(a) Ti (b) Ta (c) Compounds containing Ti (e.g., TiN, TiW, TiSiN, TiSi$_x$, TiB$_2$, TiB, TiC)

(d) Compounds containing Ta (e.g., TaB$_2$, TaB, TaC, TaN, Ta$_4$N$_5$, Ta$_5$N$_6$, Ta$_2$N)

(e) Compounds containing Zr (e.g., ZrB$_2$, ZrB, ZrC, ZrN)

(f) Compounds containing Hf (e.g., HfB, HfC, HfN)

(g) Compounds containing V (e.g., VB$_2$, VB, VC, VN)

(h) Compounds containing Nb (e.g., NbB$_2$, NbB, NbC, NbN)

(i) Compounds containing Cr (e.g., CrB$_2$, CrB, Cr$_2$B, Cr$_3$C$_2$, Cr$_2$N, CrN)

(j) Compounds containing Mo (e.g., MO$_2$B$_3$, MoB$_2$, MoB, MO$_2$B, Mo$_x$C$_y$, Mo$_2$C, MoN)

(k) Compounds containing W (e.g., W$_x$B$_y$, W$_2$B$_5$, W$_x$C$_y$, WC, W$_2$C, W$_x$N$_y$, WN)

The cap layers CP1, CP2 and the MTJ element MTJ desirably have the same planar shape for facility in the process, but may have different planar shapes. The areas of the top surfaces (the surfaces on the side of the contacts C1, C2) of the cap layers CP1, CP2 are desirably greater than the areas of the bottom surfaces (the surfaces on the side of the cap layers CP1, CP2) of the contacts C1, C2.

[3-2] Effect

According to the third embodiment described above, it is possible to obtain an effect similar to that in the first embodiment. Moreover, in the third embodiment, at least one of upper and lower contacts C1, C2 of the MTJ element MTJ is thinner such that the areas of the contacts C1, C2 contacting the recording layer 13 are reduced. Thus, magnetization inversion is caused from local contact parts between the contacts C1, C2 and the MTJ element MTJ during the write operation, and the magnetization inversion propagates due to the effect of magnetic wall movement, such that the magnetization of the whole element is inverted. Therefore, during the write operation, the write current can be reduced owing to the small contacts. Moreover, the cap layers CP1, CP2 having higher resistance than the recording layer 13 are provided so that the reduction of the effect due to current diffusion can be prevented.

[4] Fourth Embodiment

In the fourth embodiment, the MTJ element used in each of the embodiments is described.

[4-1] Modification

In the first embodiment described above, all the three layers; the fixed layer 11, the nonmagnetic layer 12 and the recording layer 13 constituting the MTJ film 10 are seamless in the direction of the word line WL, as shown in, for example, FIG. 2B. However, the MTJ film 10 is not limited to the shape described above, and can be modified to have, for example, the following shape.

(Modification 1)

Figure 15:
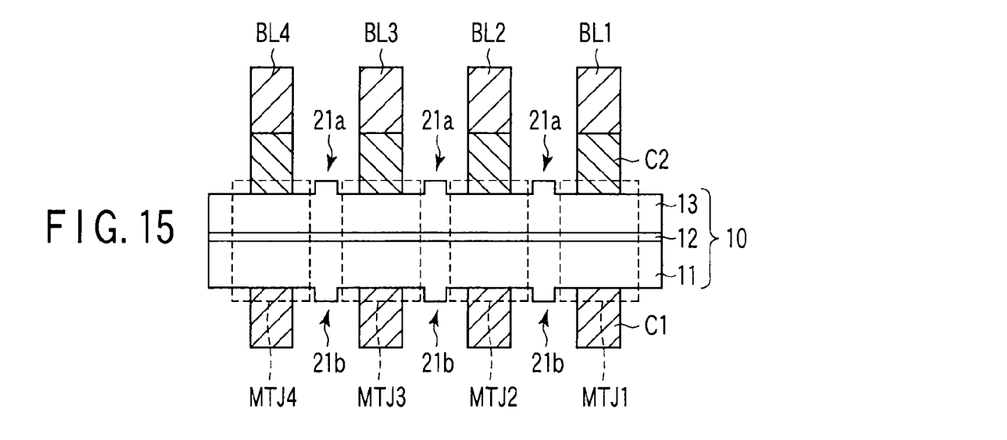
FIG. 15 is a partial sectional view of Modification 1 of a magnetic random access memory according to a fourth embodiment of the present invention.

FIG. 15 shows a partial sectional view of Modification 1 of a magnetic random access memory according to the fourth embodiment of the present invention. The structure of Modification 1 is described below.

As shown in FIG. 15, Modification 1 is different from FIG. 2B in that projections 21a, 21b are formed as separators between cells. For example, between an MTJ element MTJ1 and an MTJ element MTJ2, the projection 21a which projects higher than a surface contacting a contact C2 is provided on the contact C2 side lateral surface of a recording layer 13 (the side of the recording layer 13 opposite to a nonmagnetic layer 12), and the projection 21b which projects lower than a surface contacting a contact C1 is provided on the contact C1 side lateral surface of a fixed layer 11 (the side of the fixed layer 11 opposite to the nonmagnetic layer 12).

In addition, the projections 21a, 21b do not necessarily have to be provided on both sides of the recording layer 13 and the fixed layer 11. For example, the projections 21a may be provided on the top surface of the recording layer 13 alone in consideration of the stabilization of the magnetization of the recording layer 13.

According to Modification 1 described above, the projections 21a, 21b provided between the cells serve as the separators of the cells, so that the magnetization direction of the recording layer 13 in each cell can be stable.

(Modification 2)

Figure 16:
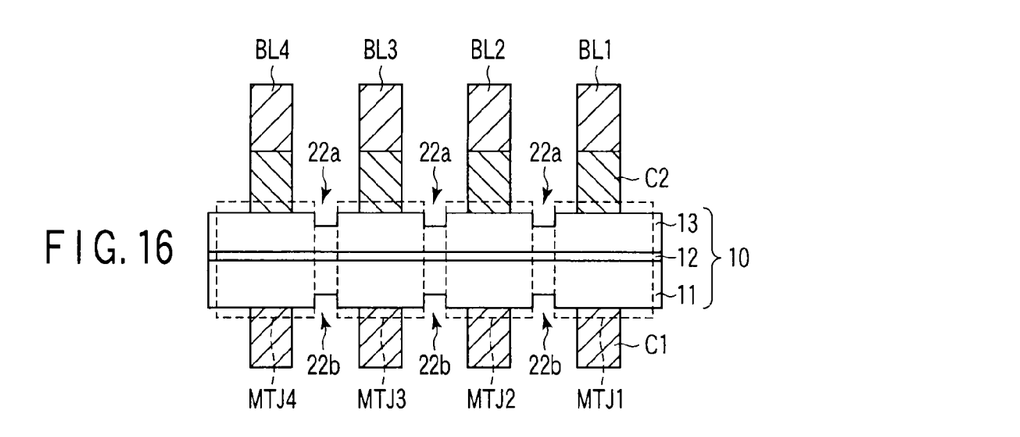
FIG. 16 is a partial sectional view of Modification 2 of the magnetic random access memory according to the fourth embodiment of the present invention.

FIG. 16 shows a partial sectional view of Modification 2 of the magnetic random access memory according to the fourth embodiment of the present invention. The structure of Modification 2 is described below.

As shown in FIG. 16, Modification 2 is different from FIG. 2B in that recesses 22a, 22b are formed as separators between cells. For example, between an MTJ element MTJ1 and an MTJ element MTJ2, the recess 22a which is recessed lower than a surface contacting a contact C2 is provided on the contact C2 side lateral surface of a recording layer 13 (the side of the recording layer 13 opposite to a nonmagnetic layer 12), and the recess 22b which is recessed higher than a surface contacting a contact C1 is provided on the contact C1 side lateral surface of a fixed layer 11 (the side of the fixed layer 11 opposite to the nonmagnetic layer 12).

In addition, the recesses 22a, 22b do not necessarily have to be provided on both sides of the recording layer 13 and the fixed layer 11. For example, the recess 22a may be provided on the top surface of the recording layer 13 alone in consideration of the stabilization of the magnetization of the recording layer 13.

According to Modification 2 described above, the recesses 22a, 22b provided between the cells serve as the separators of the cells, so that the magnetization direction of the recording layer 13 in each cell can be stable.

(Modification 3)

Figure 17:
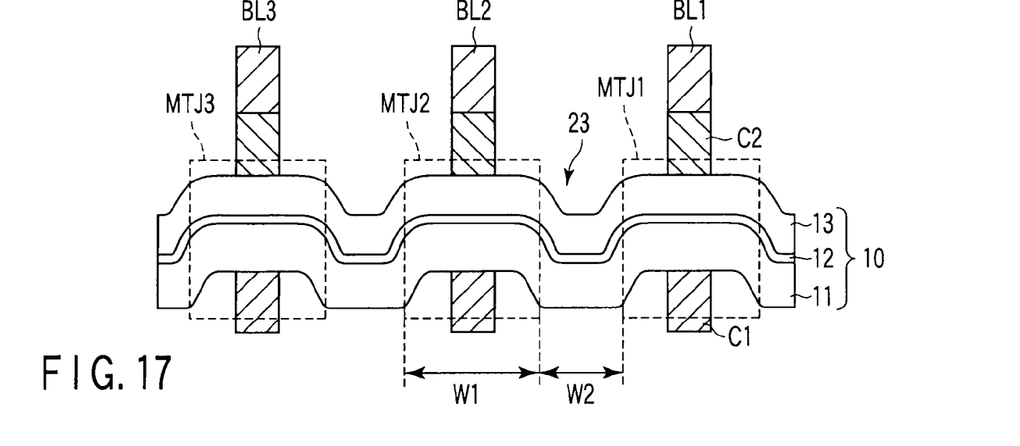
FIG. 17 is a partial sectional view of Modification 3 of the magnetic random access memory according to the fourth embodiment of the present invention.

FIG. 17 shows a partial sectional view of Modification 3 of the magnetic random access memory according to the fourth embodiment of the present invention. The structure of Modification 3 is described below.

As shown in FIG. 17, Modification 3 is different from FIG. 2B in that three layers; a fixed layer 11, a nonmagnetic layer 12 and a recording layer 13 are collectively in a wavy shape.

It is desirable here that cell parts of an MTJ film 10 connecting to bit lines are flat and that projections/recesses 23 are formed between cells. It is also desirable that the width W1 of the cell is longer than the width W2 between the cells. This makes it easier to maintain the magnetization direction of the recording layer 13 in one direction.

According to Modification 3 described above, the projections/recesses 23 provided between the cells serve as the separators of the cells, so that the magnetization direction of the recording layer 13 in each cell can be stable.

(Modification 4)

Figure 18:
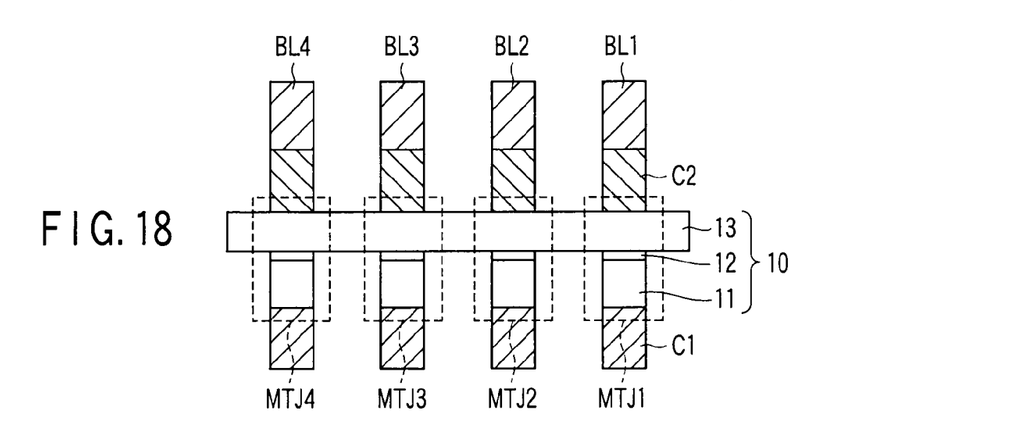
FIG. 18 is a partial sectional view of Modification 4 of the magnetic random access memory according to the fourth embodiment of the present invention.

FIG. 18 shows a partial sectional view of Modification 4 of the magnetic random access memory according to the fourth embodiment of the present invention. The structure of Modification 4 is described below.

As shown in FIG. 18, Modification 4 is different from FIG. 2B in that a recording layer 13 alone is seamless in a word line direction and a fixed layer 11 and a nonmagnetic layer 12 are divided cell by cell.

According to Modification 4 described above, the fixed layer 11 and the nonmagnetic layer 12 are divided cell by cell such that the sneak current is reduced.

(Modification 5)

Figure 19:
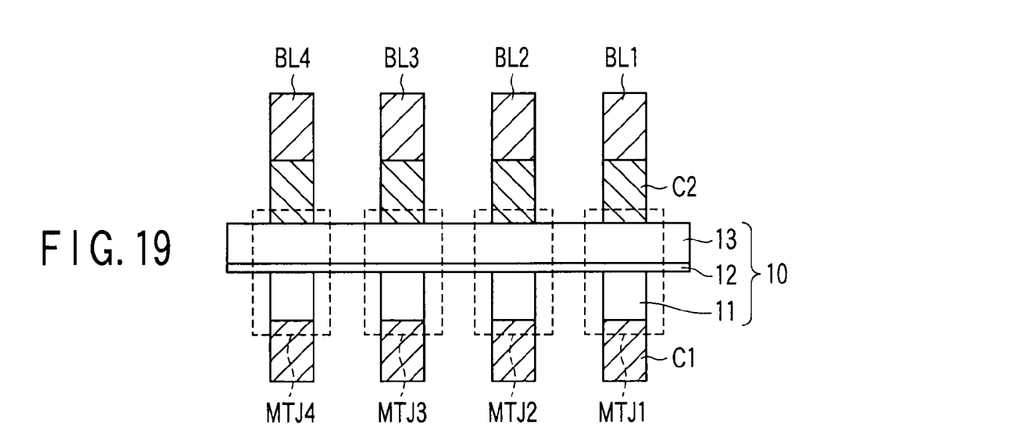
FIG. 19 is a partial sectional view of Modification 5 of the magnetic random access memory according to the fourth embodiment of the present invention.

FIG. 19 shows a partial sectional view of Modification 5 of the magnetic random access memory according to the fourth embodiment of the present invention. The structure of Modification 5 is described below.

As shown in FIG. 19, Modification 5 is different from FIG. 2B in that a recording layer 13 and a nonmagnetic layer 12 alone are seamless in a word line direction and a fixed layer 11 is divided cell by cell.

According to Modification 5 described above, the nonmagnetic layer 12 is not divided cell by cell. Thus, processing is easier than in Modification 4.

[4-2] Magnetization Configuration

The magnetization direction of the fixed layer 11 and the recording layer 13 of the MTJ element MTJ may be directed perpendicular to the film surface (perpendicular magnetization type) or may be directed parallel with the film surface (parallel magnetization type). In addition, the perpendicular magnetization type MTJ element MTJ is advantageous in that the magnetization direction is not determined by the longitudinal direction of the element shape as has heretofore been the case.

[4-3] Material

The MTJ element MTJ is made of, for example, the following materials.

For the material of the fixed layer 11 and the recording layer 13, it is preferable to use, for example, Fe, Co, Ni or an alloy of these substances, magnetite having a high spin polarizability, oxide such as $CrO_2$, $RXMnO_{3-y}$ (R; rare earth, X; Ca, Ba, Sr), and a Heusler alloy such as NiMnSb or PtMnSb. Moreover, these magnetic bodies may slightly contain nonmagnetic elements such as Ag, Cu, Au, Al, Mg, Si, Bi, Ta, B, C, O, N Pd, Pt, Zr, Ir, W, Mo and Nb as long as ferromagnetism is not lost.

For the material of the nonmagnetic layer 12, it is possible to use various dielectrics such as $Al_2O_3$, $SiO_2$, MgO, AlN, $Bi_2O_3$, $MgF_2$, $CaF_2$, $SrTiO_2$ and $AlLaO_3$. These dielectrics may have oxygen, nitrogen and fluorine deficiency.

An antiferromagnetic layer for securing the magnetization direction of the fixed layer 11 may be provided on the surface of the fixed layer 11 opposite to the nonmagnetic layer 12. For the material of this antiferromagnetic layer, it is preferable to use, for example, Fe—Mn, Pt—Mn, Pt—Cr—Mn, Ni—Mn, Ir—Mn, NiO or $Fe_2O_3$.

In addition, examples of perpendicular magnetic materials for realizing the perpendicular magnetization type MTJ element MTJ include, for example, the following materials.

First, a magnetic material having great coercive force to be used for the perpendicular magnetic material of the fixed layer 11 and the recording layer 13 is composed of materials having a high magnetic anisotropy energy density of $1 \times 10^6$ erg/cc or more. Examples of this material are described below.

EXAMPLE 1

[A material made of an alloy containing at least one of Fe (iron), Co (cobalt) and Ni (nickel) and at least one of Cr (chromium), Pt (platinum) and Pd (palladium)]

Ordered alloys include, for example, Fe(50)Pt(50), Fe(50)Pd(50) and Co(50)Pt(50). Disordered alloys include, for example, a CoCr alloy, a CoPt alloy, a CoCrPt alloy, a CoCrPtTa alloy and a CoCrNb alloy.

EXAMPLE 2

[A material having a structure in which at least one of Fe, Co and Ni or an alloy containing one of these substances and at least one of Pd and Pt or an alloy containing one of these substances are alternately stacked]

This material includes, for example, Co/Pt artificial lattice, Co/Pd artificial lattice and CoCr/Pt artificial lattice. In the case of using the Co/Pt artificial lattice and the case of using the Co/Pd artificial lattice, it is possible to attain a high value of about 40% in resistance change rate (MR ratio).

EXAMPLE 3

[An amorphous alloy made of at least one of rare earth metals such as Tb (terbium), Dy (dysprosium) or Gd (gadolinium) and at least one of transition metals]

This material includes, for example, TbFe, TbCo, TbFeCo, DyTbFeCo and GdTbCo.

Next, the recording layer 13 can be made of the above-mentioned magnetic material having great coercive force, or may also be made of a magnetic material having a magnetic anisotropy energy density lower than that of the above-mentioned magnetic material having great coercive force after the adjustment of the composition ratio, the addition of impurities and the adjustment of the thickness. Examples of such a material are described below.

EXAMPLE 1

[A material in which impurities are added to an alloy containing at least one of Fe, Co and Ni and at least one of Cr, Pt and Pd]

An ordered alloy includes, for example, an alloy in which impurities such as Cu, Cr and Ag are added to Fe(50)Pt(50), Fe(50)Pd(50) or Co(50)Pt(50) to decrease the magnetic anisotropy energy density. A disordered alloy includes, for example, a CoCr alloy, a CoPt alloy, a CoCrPt alloy, a CoCrPtTa alloy or a CoCrNb alloy in which the ratio of a nonmagnetic element is increased to decrease the magnetic anisotropy energy density.

EXAMPLE 2

[A material having a structure in which at least one of Fe, Co and Ni or an alloy containing one of these substances and at least one of Pd and Pt or an alloy containing one of these substances are alternately stacked, the thickness of a layer made of the former element or alloy or the thickness of a layer made of the later element or alloy being adjusted]

There are an optimum value of the thickness of at least one of Fe, Co and Ni or an alloy containing one of these substances and an optimum value of the thickness of at least one of Pd and Pt or an alloy containing one of these substances. As the thickness departs from these optimum values, the magnetic anisotropy energy density gradually decreases.

EXAMPLE 3

[An amorphous alloy made of at least one of rare earth metals such as Tb (terbium), Dy (dysprosium) or Gd (gadolinium) and at least one of transition metals, which composition ratio has been adjusted]

This material includes an amorphous alloy such as TbFe, TbCo, TbFeCo, DyTbFeCo or GdTbCo in which the composition ratio has been adjusted to decrease the magnetic anisotropy energy density.

[4-4] Planar Shape

The planar shape of the MTJ element MTJ in each of the embodiments described above can be changed to various shapes such as a rectangle, square, circle, ellipse, hexagon, lozenge, parallelogram, cross and bean shape (concave shape).

In the case of the parallel magnetization type MTJ element MTJ, if shape magnetic anisotropy is utilized, it is desirable to have a shape of about 2 F in the longitudinal direction (magnetization easy axis direction) where F (minimum processing dimension) is, for example, the short side direction (magnetization hard axis direction) of the MTJ element MTJ.

In the case of the perpendicular magnetization type MTJ element MTJ, the magnetization direction is not dependent on the shape, so that any of the above-mentioned shapes may be used.

[4-5] Tunnel Junction Structure

The MTJ element MTJ may have a single tunnel junction (single junction) structure or a double tunnel junction (double junction) structure.

The MTJ element MTJ of the single tunnel junction structure has a fixed layer 11, a recording layer 13 and a nonmagnetic layer 12 provided between the fixed layer 11 and the recording layer 13, as shown in FIG. 1, etc. That is, the MTJ element MTJ has one nonmagnetic layer.

The MTJ element MTJ of the double tunnel junction structure has a first fixed layer, a second fixed layer, a recording layer provided between the first fixed layer and the second fixed layer, a first nonmagnetic layer provided between the first fixed layer and the recording layer, and a second nonmagnetic layer provided between the second fixed layer and the recording layer. That is, the MTJ element MTJ has two nonmagnetic layers.

Here, all of the first and second fixed layers, the recording layer and the first and second nonmagnetic layers constituting the double tunnel junction structure may be formed in the shape of a line continuing in, for example, the direction of the word line WL, or the recording layer alone can be formed in the shape of a line and the other layers can be divided cell by cell.

The deterioration of the magnetoresistive (MR) ratio (the change rate of resistance between a "1" state and a "0" state) when the same external bias is applied is less and operation with a higher bias can be performed in the double tunnel junction structure than in the single tunnel junction structure. That is, the double tunnel junction structure is advantageous in reading information in the cells.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   a first bit line extending in a first direction;
   a second bit line which is adjacent to the first bit line in a second direction different from the first direction and which extends in the first direction;
   a first magnetoresistive effect element which is connected to the first bit line and which has a first fixed layer with a fixed magnetization direction, a first recording layer with an invertible magnetization direction, and a first nonmagnetic layer provided between the first fixed layer and the first recording layer, the magnetization directions of the first fixed layer and the first recording layer being parallel or antiparallel depending on the direction of a first current passed across the first fixed layer and the first recording layer; and
   a second magnetoresistive effect element which is adjacent to the first magnetoresistive effect element in the second direction and which is connected to the second bit line and which has a second fixed layer with a fixed magnetization direction, a second recording layer with an invertible magnetization direction, and a second nonmagnetic layer provided between the second fixed layer and the second recording layer, the first and second recording layers being formed by a same first layer extending in the second direction, the magnetization directions of the second fixed layer and the second recording layer being parallel or antiparallel depending on the direction of a second current passed across the second fixed layer and the second recording layer.

2. The memory according to claim 1, further comprising:
   a word line extending in the second direction.

3. The memory according to claim 1, wherein
   projections are formed on a side surface of the first layer opposite to the first and second nonmagnetic layers between the first and second magnetoresistive effect elements.

4. The memory according to claim 1, wherein
   recesses are formed on a side surface of the first layer opposite to the first and second nonmagnetic layers between the first and second magnetoresistive effect elements.

5. The memory according to claim 1, wherein
   the first and second nonmagnetic layers are formed by a same second layer extending in the second direction,
   the first and second fixed layers are formed by a same third layer extending in the second direction, and
   the first to third layers integrally wave, and parts of the first to third layers connecting to the first and second bit lines are flat layers.

6. The memory according to claim 1, wherein
   the first and second nonmagnetic layers are formed by a same second layer extending in the second direction, and
   the first and second fixed layers are formed by a same third layer extending in the second direction.

7. The memory according to claim 1, wherein
   the first and second nonmagnetic layers are divided, and
   the first and second fixed layers are divided.

8. The memory according to claim 1, wherein
   the first and second nonmagnetic layers are formed by a same second layer extending in the second direction, and
   the first and second fixed layers are divided.

9. The memory according to claim 1, further comprising:
   contacts which are connected to the first recording layer and which have a width in the first direction smaller than the width of the first recording layer in the first direction.

10. The memory according to claim 9, further comprising:
    a cap layer which is provided between the first recording layer and the contact and which has a resistance value higher than a resistance value of the first recording layer.

11. The memory according to claim 10, wherein
    an area of a surface of the cap layer on a side of the contacts is greater than an area of a surface of the contact on a side of the cap layer.

12. The memory according to claim 1, further comprising:
    a first contact which is connected to the first fixed layer and which has a width in the first direction smaller than a width of the first fixed layer in the first direction; and
    a second contact which is connected to the first recording layer and which has a width in the first direction smaller than a width of the first recording layer in the first direction.

13. The memory according to claim 1, wherein
    the magnetizations of the first and second fixed layers and the first and second recording layers are directed perpendicular to a film surface.

14. A write method of a magnetic random access memory, the magnetic random access memory comprising:
    a first bit line extending in a first direction;
    a second bit line which is adjacent to the first bit line in a second direction different from the first direction and which extends in the first direction;
    a first magnetoresistive effect element which is connected to the first bit line and which has a first fixed layer with a fixed magnetization direction, a first recording layer with an invertible magnetization direction, and a first nonmagnetic layer provided between the first fixed layer and the first recording layer; and
    a second magnetoresistive effect element which is adjacent to the first magnetoresistive effect element in the second direction and which is connected to the second bit line and which has a second fixed layer with a fixed magnetization direction, a second recording layer with an invertible magnetization direction, and a second nonmagnetic layer provided between the second fixed layer and the second recording layer, the first and second recording layers being formed by a same first layer extending in the second direction,
    the write method comprising:
    passing a write current across the first fixed layer and the first recording layer, and orienting the magnetization of the first recording layer parallel or antiparallel with the magnetization of the first fixed layer in accordance with the direction in which the write current is passed, in the case of writing into the first magnetoresistive effect element, wherein the write current is adjusted to control the expansion of the magnetization inversion of the first recording layer.

15. The method according to claim 14, wherein the time of passing the write current is controlled, and a magnetic wall in the first layer which is moved by the passage of the write current is stopped between the first and second magnetoresistive effect elements.

16. The method according to claim 14, wherein the range of the inversion of the magnetization in a cell is adjusted by the write current to create first to third resistance values of the first magnetoresistive effect element, the first resistance value being created when all the magnetizations of the first recording layer are parallel with the magnetization of the first fixed layer in the cell, the second resistance value being created when all the magnetizations of the first recording layer are antiparallel with the magnetization of the first fixed layer in the cell, the third resistance value being created when the first recording layer has a first magnetization parallel with the magnetization of the first fixed layer and a second magnetization antiparallel with the magnetization of the first fixed layer in the cell.

17. The method according to claim 16, further comprising:

reading data in the first magnetoresistive effect element before writing into this magnetoresistive effect element.

18. The method according to claim 16, further comprising:

reading the resistance value of the first magnetoresistive effect element after writing into the first magnetoresistive effect element; and repassing the write current across the first fixed layer and the first recording layer when the resistance value of the first magnetoresistive effect element has not reached a threshold value.

19. The method according to claim 14, wherein projections or recesses are formed on the lateral surface of the first layer opposite to the first and second nonmagnetic layers between the first and second magnetoresistive effect elements.

20. The method according to claim 14, wherein the magnetizations of the first and second fixed layers and the first and second recording layers are directed perpendicular to a film surface.

* * * * *